(12) United States Patent
Almanza-Workman et al.

(10) Patent No.: US 8,017,293 B2
(45) Date of Patent: Sep. 13, 2011

(54) LIQUID TONER-BASED PATTERN MASK METHOD AND SYSTEM

(75) Inventors: A. Marcia Almanza-Workman, Sunnyvale, CA (US); Carl P. Taussig, Redwood City, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1191 days.

(21) Appl. No.: 11/733,176

(22) Filed: Apr. 9, 2007

(65) Prior Publication Data
US 2008/0248405 A1    Oct. 9, 2008

(51) Int. Cl.
*G03G 5/00* (2006.01)
(52) U.S. Cl. ................. 430/117.3; 430/117.1; 430/5
(58) Field of Classification Search ............. 430/117.3, 430/117.1, 5; 399/237
See application file for complete search history.

(56) References Cited

U.S. PATENT DOCUMENTS

| | | | |
|---|---|---|---|
| 4,389,432 A | 6/1983 | Inoue et al. | |
| 6,080,606 A | 6/2000 | Gleskova et al. | |
| 6,162,570 A | 12/2000 | Maess et al. | |
| 6,709,962 B2 | 3/2004 | Berg | |
| 6,742,884 B2 * | 6/2004 | Wong et al. | 347/99 |
| 6,746,946 B2 | 6/2004 | Berg | |
| 6,849,308 B1 | 2/2005 | Speakman et al. | |
| 6,872,320 B2 | 3/2005 | Wong et al. | |
| 6,936,181 B2 | 8/2005 | Bulthaup et al. | |
| 6,957,608 B1 | 10/2005 | Hubert et al. | |
| 7,078,141 B2 | 7/2006 | Ben-Avraham et al. | |
| 2002/0092825 A1 * | 7/2002 | Schneider et al. | 216/49 |
| 2005/0263903 A1 | 12/2005 | Forbes et al. | |
| 2006/0112858 A1 | 6/2006 | Nguyen | |

FOREIGN PATENT DOCUMENTS
JP    10207130 A    8/1998

OTHER PUBLICATIONS

Author Unknown, "A closer look: white paper—digital offset color", Copyright Hewlett-Packard Company 2002.
K. Biswas et al., "Bulk micromachining of silicon in TMAH-based etchants for aluminum passivation and smooth surface", Microelectronics Journal, vol. 37, 2006, pp. 321-327.
Udi Chatow and Ronen Samuel, "Digital Labels Printing", IS&T NIP19: 2003 International Conference on Digital Printing Technologies, pp. 476-481.

* cited by examiner

*Primary Examiner* — Mark A Chapman

(57) ABSTRACT

A liquid toner-based pattern mask system and methods of masking and patterning a substrate employ a polymer-based liquid toner as a pattern mask. The liquid toner is deposited on the substrate in a masking pattern. The pattern mask is lifted off of the substrate after patterning the substrate using a lift-off technique that breaks a bond between the surface of the substrate and the pattern mask.

21 Claims, 2 Drawing Sheets

LIQUID TONER-BASED PATTERN MASK METHOD AND SYSTEM

CROSS-REFERENCE TO RELATED APPLICATIONS

N/A

STATEMENT REGARDING FEDERALLY SPONSORED RESEARCH OR DEVELOPMENT

N/A

BACKGROUND

1. Technical Field

The invention relates to circuit fabrication. In particular, the invention relates to lithography used to define features during printed circuit and semiconductor fabrication.

2. Description of Related Art

For much of the history of modern electronics, optical lithography has been the principal means of patterning substrates in the fabrication of printed circuits, semiconductors, and related structures. In optical lithography, a photoresist is deposited onto a surface of a substrate being patterned. A source of radiation (e.g., ultraviolet light, electron beam, etc.) is then employed to differentially expose the photoresist and impart a pattern thereto. For example, the photoresist may be exposed to ultraviolet light projected through a photomask such that a pattern of the photomask is transferred to the photoresist. The photoresist bearing the transferred pattern forms a pattern mask that protects specific portions of the substrate that are covered by the pattern mask. Various techniques such as pattern etching and pattern lift-off are then employed to transfer the pattern of the photoresist pattern mask to a surface of the substrate.

Relatively recently, other methods of creating a pattern mask for substrate patterning have been proposed and, in some cases, have begun to gain acceptance as viable alternatives to photolithography. Among these techniques are imprint lithography and digital resist printing. In imprint lithography, a pattern mold is employed to mechanically imprint a pattern into a relatively soft resist material on a surface of the substrate. The imprinted soft resist material is then employed as a mask in a manner similar to the photoresist pattern mask.

In digital resist printing, a pattern mask is printed directly onto the substrate using a digital printer or equivalent. For example, an inkjet printer may be employed to print a liquid resist onto a substrate in a manner similar to that used to print an image onto a piece of paper. The inkjet printer essentially applies the liquid resist as a series of directed droplets that combine to form the pattern mask. In another example, a laser printer is employed to directly print the pattern mask onto the substrate. The laser printer employs a dry toner comprising a fine powder that is electrostatically guided and imaged onto the substrate under digital control of the printer. After being imaged, particles of the dry toner are fused together on the substrate to form the pattern mask. Either of the inkjet printer-applied liquid resist or the laser printer-applied dry toner produces a pattern mask that may be employed in a manner similar to the photoresist pattern mask to pattern the substrate.

Advantageously, digital resist printing does not depend on the creation and use of either a photomask or a mold. As such, the mask pattern can be readily changed or adjusted during substrate patterning. However, inkjet-based resist printing is relatively slow. Thus, inkjet-based resist printing may be of limited use, especially for high speed and/or high volume printed circuit production (e.g., roll-to-roll processing). The use of laser printers for direct printing of a dry toner-based pattern mask can support high speed, high volume production. However, the dry toner employed by laser printers severely limits an ultimate resolution of the pattern and further suffers from problems of line edge fidelity and unwanted background printing caused by powder dispersion during printing.

BRIEF SUMMARY

In some embodiments of the present invention, a method of masking a substrate is provided. The method of masking a substrate comprises using a liquid toner as a pattern mask. The liquid toner comprises a carrier liquid and toner particles dispersed in the carrier liquid. The toner particles comprise a polymer. According to the method of masking a substrate, the liquid toner is deposited on the substrate as the pattern mask.

In other embodiments of the present invention, a method of patterning a substrate is provided. The method of patterning a substrate comprises applying a pattern mask to the substrate using liquid electrophotographic (LEP) printing. The pattern mask comprises a polymer-based liquid toner. The method of patterning a substrate further comprises patterning the substrate using the pattern mask; and lifting-off the pattern mask from the patterned substrate. Lifting-off comprises exposing the substrate to a lift-off solution having a basic pH such that a bond between the substrate and the pattern mask is broken.

In other embodiments of the present invention, a liquid toner-based pattern mask system is provided. The liquid toner-based pattern mask system comprises a polymer-based liquid toner. The liquid toner acts as a pattern mask on a surface of a substrate. The pattern mask is employed in patterning the substrate. The liquid toner-based pattern mask system further comprises a lift-off agent. The lift-off agent degrades a bond between the surface of the substrate and the pattern mask to facilitate removal of the pattern mask following substrate patterning.

Certain embodiments of the present invention have other features in addition to and in lieu of the features described hereinabove. These and other features of the invention are detailed below with reference to the following drawings.

BRIEF DESCRIPTION OF THE DRAWINGS

The various features of embodiments of the present invention may be more readily understood with reference to the following detailed description taken in conjunction with the accompanying drawings, where like reference numerals designate like structural elements, and in which.

DETAILED DESCRIPTION

Figure 1:
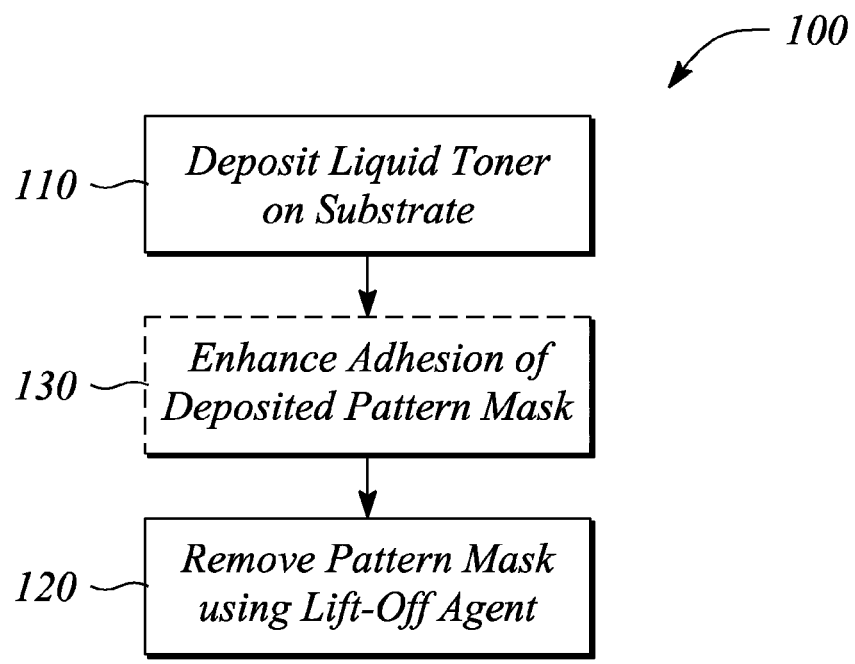
FIG. 1 illustrates a flow chart of a method of masking a substrate according to an embodiment of the present invention.

Embodiments of the present invention facilitate masking and subsequently patterning a substrate using a pattern mask. In particular, embodiments of the present invention employ a liquid toner to produce the pattern mask. According to various embodiments of the present invention, the pattern mask is produced by imparting a pattern (i.e., masking pattern) to the liquid toner to produce a 'patterned liquid toner'. The patterned liquid toner is then deposited onto a surface of the substrate. In some embodiments, the patterned liquid toner is partially or completely dried and fused prior to being deposited onto the substrate surface (e.g., offset printing) to produce the pattern mask. The pattern mask is employed in patterning the substrate, thereby obviating a need for a photomask and another masking material (e.g., photoresist). Herein, the pattern mask produced from the liquid toner is sometimes referred to as a 'liquid toner pattern mask' without distinction between the terms.

According to various embodiments herein, the liquid toner pattern mask facilitates high speed processing of substrates using digital mask definition and deposition. For example, the liquid toner pattern mask may be employed in roll-to-roll, high-throughput patterning of large-area flexible substrates used for flexible displays and related flexible circuits. Using digital mask definition, a configuration of the liquid toner pattern mask may be changed 'on the fly' during masking in the roll-to-roll patterning process. In another example, the liquid toner pattern mask may be employed to mask successive, discrete substrates for subsequent patterning. In this example, a configuration of the liquid toner pattern mask may be changed 'on the fly' (e.g., from one substrate to the next or within a substrate). Various embodiments of the present invention facilitate both single-sided and double sided patterning and are applicable to single layer as well as multi-layer printed circuit fabrication.

The liquid toner pattern mask according to various embodiments of the present invention is applicable to a wide variety of substrate patterning methodologies including, but not limited to, pattern etching and pattern lift-off. The term 'etching' as used herein generally includes both dry etching and wet etching. An 'etchant', as referred to herein, is an active agent employed in an etching process. For example, a solution of either a strong acid or a strong base may be the etchant in an exemplary wet etching process. An oxygen, fluorinated or chlorinated plasma may serve as the etchant in an exemplary dry etching process (e.g., reactive ion etching—RIE), for example.

In pattern etching, the pattern mask acts to cover and protect a portion of the substrate while allowing the etchant to etch other exposed or uncovered portions thereof. For example, an etchant may be employed to etch a metal layer on a surface of the substrate. The metal may be aluminum (Al), silver (Ag), gold (Au), copper (Cu), chromium (Cr), titanium (Ti), tungsten (W), zinc (Zn), various alloys thereof or essentially any other metal or metal alloy. A portion of the metal layer that is covered by the pattern mask is protected from the etchant and remains essentially intact after etching. Another portion of the metal layer that is not covered by the pattern mask is removed (i.e., etched) by an action of the etchant. The portion of the metal layer that remains after etching takes on a pattern of the pattern mask after etching and represents the substrate patterning produced by pattern etching. Other materials and layers thereof that may be patterned by pattern etching include, but are not limited to, semiconductor materials, oxides (both conductive and semiconductive), and dielectrics. For example, semiconductor materials may comprise one or more of silicon (Si), germanium (Ge), gallium arsenide (GaAs), indium tin oxide (abbreviated 'ITO'), and zinc oxide (ZnO). Dielectrics may comprise silicon dioxide ($SiO_2$), germanium dioxide ($GeO_2$), fluorosilicates, zirconium silicate, and various polymer dielectrics.

In pattern lift-off, the pattern mask is applied to the substrate and then a layer or layers to be patterned is applied over the pattern mask. Removal of the pattern mask 'lifts-off' those portions of the layer to be patterned (e.g., metallization) that are not in contact with the substrate. For example, the pattern mask is applied to the substrate surface. The substrate surface and applied pattern mask are then coated with a metallization layer or another layer to be patterned. When the pattern mask is removed, a portion of the metallization layer lying on the pattern mask itself is lifted off of the substrate surface. Another portion of the metallization layer not lying on the pattern mask remains intact on the substrate. The metallization layer that remains and does not lift-off when the pattern mask is removed represents the substrate patterning produced by the pattern lift-off.

For simplicity of discussion only, no distinction is made herein between the substrate itself and the substrate comprising one or more material layers on a surface of the substrate (e.g., a surface metallization layer, cladding or foil) unless such distinction is necessary for proper understanding. Thus, by definition herein 'patterning the substrate' refers equally to patterning the substrate itself and/or to patterning a layer or layers on the substrate surface. In particular, patterning the substrate explicitly includes patterning one or more thin film layers (e.g., multiple thin film layers) on or adjacent to one or both of a front surface and a back surface of the substrate, according to some embodiments. For example, patterning the substrate may comprise selectively removing by pattern etching portions of a thin film layer on the substrate surface where the thin film layer comprises one or more of a semiconductor, a dielectric and a conductor.

As used herein, the article 'a' is intended to have its ordinary meaning in the patent arts, namely 'one or more'. For example, 'a layer' means one or more layers and as such, 'the layer' means 'the layer(s)' herein. Moreover, any reference herein to 'top', 'bottom', 'upper', 'lower', 'left' or 'right' is not intended to be a limitation herein. Further, examples herein are intended to be illustrative only and are presented for discussion purposes and not by way of limitation.

FIG. 1 illustrates a flow chart of a method 100 of masking a substrate according to an embodiment of the present invention. The method 100 of masking a substrate produces a pattern mask that may be employed to pattern a substrate, according to some embodiments. The pattern mask produced by the method 100 of masking is generally applicable to either pattern etching or pattern lift-off for patterning a substrate.

The method 100 of masking a substrate comprises using a liquid toner as a pattern mask in masking the substrate. The method 100 of masking a substrate using a liquid toner as a pattern mask comprises depositing 110 the liquid toner on the substrate as the pattern mask. In some embodiments, depositing 110 the liquid toner comprises imparting a pattern (i.e., masking pattern) to the liquid toner to yield a patterned toner. Herein, 'imparting the pattern' is also referred to as 'patterning the liquid toner' (i.e., the 'patterned toner'). Depositing 110 the liquid toner further comprises fusing the patterned toner to produce the pattern mask. Depositing 110 the liquid toner further comprises applying the patterned toner to a surface of the substrate.

In some embodiments, the patterned toner is completely fused prior to being applied to a surface of the substrate. In such embodiments, applying the patterned toner essentially applies the pattern mask to the substrate surface. In other embodiments, fusing the patterned toner is performed after applying the patterned toner to the substrate surface. In such embodiments, the pattern mask is produced in situ on the substrate surface from the applied but not yet fused patterned toner. In yet other embodiments, the patterned toner is partially fused prior to being applied and then, is further fused once applied to yield the liquid toner pattern mask that masks the substrate. However, in all embodiments, the liquid toner is always patterned prior to being applied to the substrate surface.

The liquid toner comprises a carrier liquid and polymer-based toner particles dispersed in the carrier liquid. The polymer-based toner particles are electrically charged or at least capable of being electrically charged, depending on the embodiment. Typically, toner particles in the liquid toner are charged using charge directors as opposed to triboelectrification which is used with dry toners. As such, the liquid toners are readily distinguished from their dry toner counterparts. The electrical charge of the toner particles is employed to electrically control a deposition location of the particles during toner patterning. In some embodiments, the location of the particles is a result of electrically guiding the particles during toner patterning using an electric field.

The polymer-based toner particles comprise a polymer that is resistant to an etchant once deposited 110 and as such, fused on the substrate. The polymer may comprise a blend of polymers (i.e., a polymer blend) in some embodiments. Examples of liquid toners and constituent toner particles thereof are described in a number of U.S. patents including, but not limited to, U.S. Pat. Nos. 4,794,651, 4,842,974, and 6,146,803, all of which are incorporated by reference herein. In some embodiments, the polymer blend comprises one or both of a polymer and a copolymer. For example, the polymer blend may comprise a first polymer and a second polymer as described by Ben-Avraham et al., U.S. Pat. No. 7,078,141 B2, incorporated herein by reference. In some embodiments, the liquid toner comprises a commercially available polymer-based liquid toner such as, but not limited to, HP ElectroInk. ElectroInk® is a registered trade mark of Indigo, N.V., The Netherlands, and is owned and marketed by Hewlett-Packard Development Company, Texas (hereinafter 'Hewlett-Packard') as HP ElectroInk.

HP ElectroInk comprises a polymer blend of ethylene acrylic acid and methacrylic acid copolymers. The polymer blend of HP ElectroInk lacks ester groups that might suffer from hydrolytic degradation that may be accelerated by strong acids and strong bases often employed as wet etchants for circuit board and semiconductor processing. As such, the HP ElectroInk polymer blend is compatible with a majority of wet etchants in current use for circuit fabrication. The HP ElectroInk polymer blend is equally compatible with various plasma chemistries employed in dry etching (e.g., etching aluminum with $BCl_3/Cl_2$ plasmas).

Herein, reference to a 'liquid toner' explicitly includes all liquid toners marketed as HP ElectroInk or equivalent thereto, unless otherwise stated. In addition to ethylene acrylic acid and methacrylic acid copolymers of HP ElectroInk mentioned above, the polymer blend may comprise various polymer and copolymer resins including, but are not limited to, ethylene acrylic acid copolymer, acid-modified ethylene acrylate copolymer, copolymer of ethylene-glycidyl methacrylate, terpolymer of ethylene-methyl acrylate-glycidyl methacrylate, and similar, related resin compounds.

HP ElectroInk and other equivalent liquid toners generally employ toner particles having a size range of about 1 micron or smaller. By comparison, dry toners typically employ much bigger toner particles (e.g., typically 3-10 microns) since smaller particles used as a dry toner cannot be readily controlled and effectively guided during printing. Liquid toner overcomes the control problem of small particles by the addition of the liquid carrier, among other mechanisms. As such, using the liquid toner as a pattern mask may result in a relatively thinner, more uniform, pattern mask that exhibits significantly improved resolution and line edge fidelity than would be possible with a dry toner-based mask. In addition, the used of liquid toner may greatly reduce a presence of unwanted background printing in non-image areas of the pattern mask.

Furthermore, HP ElectroInk fuses at about 90 degrees Celsius (C). Dry toners typically require 140-160 degrees C. for fusing, which can severely limit a selection of substrate materials that may be employed. Using liquid toner such as HP ElectroInk facilitates a wider choice of substrate materials especially when considering flexible and/or organic material-based substrates. Similarly, the polymer-based liquid toners typically produce a more flexible printed image than is possible with dry toners such that the use of liquid toners for pattern mask applications involving flexible substrates is further facilitated.

In some embodiments, depositing 110 the liquid toner on the substrate surface uses digital electrophotographic printing. Herein, digital electrophotographic printing is also known as electro-digital printing (EDP). In particular, in some embodiments, a form of EDP known as liquid electrophotographic (LEP) printing is employed to deposit 110 the liquid toner on the substrate surface and produce the liquid toner pattern mask. Further, offset LEP printing or more specifically, thermal offset LEP printing may be employed during depositing 110, according to some embodiments. As such, depositing 110 a liquid toner essentially comprises printing 110 the liquid toner onto the substrate to produce the liquid toner pattern mask, according to some embodiments.

In thermal offset LEP printing, a pattern (e.g., mask pattern) is created and optically written onto an electrophotographic photosensitive imaging plate (PIP). For example, the PIP may be scanned by an array of lasers under control of a digitally defined pattern. The liquid toner is then sprayed, rolled or otherwise applied onto the PIP in an inking operation. A desired pixel pattern on the PIP is produced by a developer roller. Charged toner particles of the liquid toner preferentially adhere to image areas of the PIP and are removed from non-image areas such that the remaining liquid toner takes on the desired pixel pattern of the PIP.

The patterned liquid toner is transferred to an electrically charged blanket of an offset or transfer cylinder. The patterned toner is heated on the transfer cylinder to remove the carrier liquid and to partially melt and fuse the toner particles. The melting and fusing causes the toner particles to coalesce into a relatively smooth, continuous film. The fused toner particles essentially form a hot adhesive plastic on the transfer cylinder blanket while retaining the pattern. Finally, the fused toner particles on the blanket of the transfer cylinder are brought into contact with and transferred to the substrate. Examples of offset LEP printers that may be used to deposit 110 the liquid toner as a patterned toner onto the substrate according to the present invention include, but are not limited to, the HP Indigo press ws4050, the HP Indigo press ws4500, and the HP Indigo press 5000 series printers, all products of Hewlett-Packard.

In some embodiments, multiple layers of the liquid toner may be used to produce the liquid toner pattern mask. In particular, the use of multiple layers may improve characteristics of the liquid toner pattern mask related to one or more of mask porosity, edge quality and percent coverage when compared to a pattern mask using a single layer of liquid toner. In general, multiple layers of liquid toner may be applied during deposition 110 using successive passes of the substrate through the LEP printer. In each pass, an additional layer of liquid toner is added to the pattern mask on the substrate.

Alternatively, multiple layers of liquid toner may be deposited 110 in a single pass on the substrate through the LEP printer. For example, when using offset thermal LEP printing, multiple layers of liquid toner may be patterned and accumulated on the transfer cylinder blanket prior to being applied to the substrate surface in a single transfer pass during deposition 110. Registration between multiple layers of liquid toner on the transfer cylinder is generally much easier to control than applying the patterned toner to the substrate in successive passes. As such, excellent pattern fidelity may be achieved using the single pass multilayer approach.

In addition, most offset thermal LEP printers are color printers that have an ability to deposit each of several colors of toner onto a substrate. Such LEP printers often deposit multiple colors onto the transfer cylinder prior to transferring the color image to the substrate as a normal part of printing a color image. As such, advantage may be taken of this inherent ability to print multiple colors by 'stacking' liquid toners that represent different colors to produce the desired multiple layers of liquid toner. In stacking, liquid toner representing each of several colors is printed in a common region of the image, one on top of the other. For example, creating a two-layer pattern mask may be realized by printing liquid toner representing two different colors in a same region of the mask pattern. An actual pigment color of the liquid toner is not generally a concern in depositing 110 the liquid toner pattern mask. For example, a black toner and a cyan toner may function equally well as the liquid toner pattern mask.

The method 100 of masking further comprises removing 120 the liquid toner pattern mask using a lift-off agent having a basic pH. The basic pH of the lift-off agent is a pH generally much greater than about 7.0. In some embodiment, the basic pH is between about 11 and about 14. Removing 120 the liquid toner pattern mask using a lift-off agent (i.e., lift-off of the pattern mask) is not to be confused with 'pattern lift-off' for patterning the substrate. However, removing 120 the liquid toner pattern mask may be employed to realize pattern lift-off during patterning, in some embodiments.

Exposure of the liquid toner pattern mask to the lift-off agent during removal 120 acts to break a bond between the surface of the substrate and the pattern mask to disconnect the pattern mask from the substrate. In some embodiments, the lift-off agent is a lift-off solution comprising a relatively strong base. A lift-off agent or solution is distinguished from a solvent that dissolves a material of the pattern mask. Specifically, the lift-off agent primarily affects the bond between the substrate surface and the pattern mask and not an overall integrity of the pattern mask itself. In some embodiments, the pattern mask may be removed 120 from the substrate surface in an essentially intact configuration using the lift-off agent. In other words, the lift-off agent may essentially 'lift-off' an intact pattern mask from the substrate. In other embodiments, the lift-off agent may both lift-off and partially or completely dissolve (or otherwise disintegrate) the pattern mask during removing 120 the pattern mask.

In some embodiments, the lift-off agent comprises tetramethyl ammonium hydroxide (TMAH) as the strong base. In some such embodiments, an aqueous solution of TMAH is employed. For example, an aqueous solution of TMAH having a pH that is greater than or equal to about 13 may be employed as the lift-off agent. TMAH has an absence of metal ions that may adversely affect or contaminate the substrate being patterned and is generally compatible with conventional circuit processing and fabrication. For example, metal ions can diffuse into device layers and adversely affect electrical characteristics thereof.

In an example of employing the method 100 of masking a substrate using liquid toner, HP ElectroInk was deposited 110 on an aluminum clad polyimide substrate and later removed 120 by exposing the substrate to an aqueous solution of TMAH at room temperature. Removal 120 of two deposited 110 layers of HP ElectroInk was demonstrated to occur in less than about 40 seconds with a 2.5% TMAH solution at room temperature and having a pH of about 13.

Other lift-off agents include, but are not limited to, aqueous solutions comprising one or more of potassium hydroxide (KOH), sodium hydroxide (NaOH) benzyltrimethyl ammonium hydroxide, tetraethyl ammonium hydroxide, tetrabutyl ammonium hydroxide and tetrapropyl ammonium hydroxide. Similarly, combinations of any of the above listed aqueous solutions and TMAH may also be employed as the lift-off agent. Further, non-aqueous solutions of TMAH and similar compounds may also be employed as the lift-off agent, according to embodiments of the present invention.

In some embodiments, the lift-off agent further comprises a passivating agent. The passivating agent mitigates any deleterious effect that the basic pH may have on the substrate during removing 120 the pattern mask. For example, the passivating agent may be used to protect a metal layer on the substrate from being etched by the lift-off agent during removing 120. In some embodiments, silicic acid is employed as the passivating agent. For example, an aqueous solution comprising TMAH and silicic acid may be employed as the lift-off agent.

In the previously discussed example of an aluminum clad polyimide substrate, silicic acid passivates and essentially protects the aluminum cladding from possible corrosive effects of TMAH. Full passivation of the exposed aluminum cladding has been demonstrated using an approximately equal molar aqueous solution of silicic acid and TMAH for removing 120 the pattern mask. However, the presence of silicic acid may increase a lift-off time of removing 120 the pattern mask. An aqueous solution of about 5% TMAH and 28 grams/Liter (g/L) of silicic acid provided a reasonable trade-off between aluminum passivation and lift-off time when HP ElectroInk was employed as the liquid toner.

In some embodiments, the lift-off solution is made by adding deionized water to a 25% TMAH semiconductor grade solution to obtain a desired TMAH concentration (e.g., 5% TMAH solution). Silicic acid is then added to a desired concentration (e.g., 28 g/L) and the solution is heated to dissolve the silicic acid. For example, the solution may be heated to about 80 degrees C. for about 30 to 60 minutes to completely dissolve the silicic acid. Water evaporation during dissolution may be minimized by using a beaker with a reflux condenser, for example. In some embodiments, full dissolution of silicic acid is targeted and the solution is discarded if any undissolved silicic acid is detectable after about 60 minutes.

As was noted above, in some embodiments, non-aqueous TMAH solutions may be employed as the lift-off agent for removing 120 the pattern mask. For example, a non-aqueous TMAH solution known as PRX-127 may be used as the lift-off agent. PRX-127 comprises 30% dipropylene glycol monomethyl ether, 75% dimethyl sulfoxide and 4% TMAH pentahydrate and is marketed by Rohm and Hass, Philadelphia, Pa. Removal 120 of two layers of deposited 110 HP ElectroInk with the PRX-127 lift-off agent used a somewhat longer exposure time and a higher temperature than room temperature when compared to the aforementioned aqueous solution of TMAH. In some embodiments, the lift-off agent may comprise or further comprise a mechanical means for breaking the bond between the pattern mask and the substrate.

In some embodiments of the method 100 of masking a substrate, a coating that acts as an adhesion layer between the substrate and a metal layer to be patterned is useful. For example, TMAH is known to attack and degrade polyimide under certain circumstances. Employing an adhesion layer such as, but not limited to, silicon dioxide ($SiO_2$) or silicon nitride ($Si_3N_4$), between the polyimide substrate and an aluminum layer, for example, helps to prevent the TMAH lift-off agent from degrading the polyimide and adversely affecting the adhesion of the aluminum layer. In particular, both $SiO_2$ and $Si_3N_4$ independently exhibit excellent selectivity to TMAH.

In some embodiments, the method 100 of masking a substrate further comprises enhancing 130 adhesion of the deposited 110 liquid toner pattern mask to the substrate surface. In some embodiments, enhancing 130 adhesion comprises annealing the liquid toner pattern mask following deposition 110. In some embodiments, annealing comprises heating the substrate with the deposited 110 pattern mask to a temperature sufficient to volatilize residual carrier liquid or solvent that may remain in the pattern mask following deposition 110 on the substrate.

For example, HP ElectroInk comprises an isoparaffin solvent (Isopar®) as a carrier liquid. Isopar® is a registered trademark of ExxonMobile, NJ. Isopar® has a boiling point of 189 degrees C. but begins to evaporate around 100 degrees C. and exhibits a relatively higher evaporation rate in a temperature range between 120 and 130 degrees C. Enhancing 130 adhesion may comprise annealing by heating the substrate and the liquid toner pattern mask to a temperature of above about 100 degrees C. and, in some embodiments, to a temperature of between 120 and 130 degrees C. Instead of or in addition to annealing, enhancing 130 adhesion may comprise cleaning the substrate surface prior to depositing 110 the liquid toner pattern mask. For example, the substrate surface may be exposed to an oxygen plasma (e.g., reactive ion etching) to thoroughly clean the surface prior to depositing 110 the liquid toner pattern mask.

In some embodiments, enhancing 130 adhesion may comprise employing an adhesion enhancer instead of or in addition to annealing. In these embodiments, enhancing 130 adhesion may be performed before depositing 110 (not illustrated). The adhesion enhancer is a material that is introduced to facilitate a bond between the substrate surface and the pattern mask. The adhesion enhancer may further one or both of minimize an effect that an etchant has on the bond and facilitate an action of the lift-off agent, according to various embodiments. The adhesion enhancer may be introduced by coating (i.e., pre-coating) the substrate surface with the adhesion enhancer prior to depositing 110 the liquid toner pattern mask. One or more adhesion enhancers may be employed for enhancing 130 adhesion depending on the substrate material(s), the etchant that may be used in processing the substrate, and the particular lift-off agent(s) being employed, for example.

In some embodiments, the adhesion enhancer employed in enhancing 130 adhesion is an amino-organosilane. In such embodiments, enhancing 130 adhesion comprises pre-coating the substrate with the amino-organosilane adhesion enhancer. In some embodiments, the adhesion enhancer comprises polyethyleneimine (Lupasol®). Lupasol® is a registered trademark of BASF Corporation, NJ. As with amino-organosilanes, enhancing 130 adhesion with Lupasol® comprises pre-coating the substrate prior to depositing 110.

The method 100 of masking a substrate is applicable to patterning the substrate using either pattern etching or pattern lift-off after the liquid toner pattern mask is deposited 110. For example, wet etching may be employed to etch a metal film on a surface of the substrate using the liquid toner pattern mask to guide the etching. Referring to the exemplary aluminum-clad substrate discussed above, a commercially available acidic wet etchant may be employed to pattern aluminum film protected by the liquid toner pattern mask, according to various embodiments. An example of an acidic wet etchant for aluminum is AL-12S marketed by Cyantek, Fremont, Calif. AL-12S comprises 74% phosphoric acid, 10% acetic acid, 2% nitric acid, 14% water and 1% surfactant.

Figure 2:
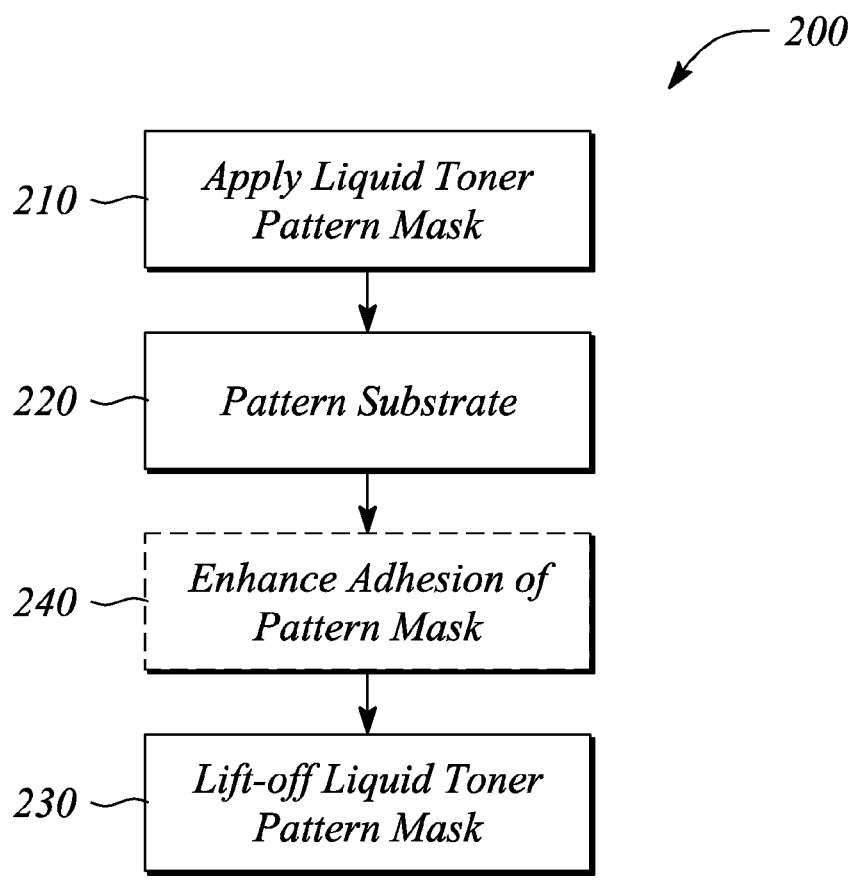
FIG. 2 illustrates a flow chart of a method of patterning a substrate according to an embodiment of the present invention.

FIG. 2 illustrates a flow chart of a method 200 of patterning a substrate according to an embodiment of the present invention. As defined above, the term substrate means one or more of the substrate itself and a layer or layers on a surface of the substrate. Thus, the method 200 of patterning is applicable to patterning a single cladding layer as well a multiple cladding layers (e.g., single or multiple thin films of one or more of a metal, a semiconductor and a dielectric) on one or more surfaces of the substrate and/or patterning the substrate material itself, according to various embodiments. For example, the substrate may comprise a sheet of material that is coated or clad on one or more of a front surface and a back surface with a metal foil. The exemplary substrate material may comprise a flexible polyimide sheet and the exemplary metal foil may comprise aluminum, for example. The method 200 of patterning defines a pattern in the metal foil cladding on the substrate, in this example.

The method 200 of patterning a substrate comprises applying 210 a liquid toner pattern mask to the substrate using liquid electrophotographic (LEP) printing. LEP printing is described above with respect to the method 100 of masking. The liquid toner pattern mask comprises a polymer-based liquid toner that is fused on a surface of the substrate. The polymer-based liquid toner is described above with respect to the method 100 of masking and explicitly includes, but is not limited to, HP ElectroInk liquid toner.

In some embodiments, applying 210 a liquid toner pattern mask comprises roll-to-roll printing of the liquid toner pattern mask onto a flexible substrate. The flexible substrate comprises a flexible sheet and a metal film affixed to one or both of a top surface and a bottom surface of the flexible sheet.

The method 200 of patterning further comprises patterning 220 the substrate. Patterning 220 the substrate may comprise one or both of pattern etching and pattern lift-off, depending on the embodiment, employing the applied 210 liquid toner pattern mask. In some embodiments, patterning 220 the substrate comprises etching one or both of the substrate and a layer(s) (e.g., a metal foil) on a surface of the substrate. For example, patterning 220 the substrate by etching may comprise exposing the aforementioned exemplary aluminum clad polyimide substrate to an acid etchant such as, but not limited to, AL-12S. The etchant preferentially attacks and removes the aluminum that is exposed by the liquid toner pattern mask. The aluminum covered by the pattern mask is protected from the etchant and is not etched. The removal of the exposed aluminum patterns 220 the aluminum cladding on the polyimide substrate.

The method 200 of patterning a substrate further comprises lifting-off 230 the liquid toner pattern mask from the patterned 220 substrate. Lifting-off 230 the liquid toner pattern mask is essentially similar to removing 120 the liquid toner pattern mask described above with respect to the method 100 of masking a substrate. In particular, lifting-off 230 the liquid toner pattern mask comprises exposing the substrate to a lift-off solution having a basic pH such that a bond between the substrate and the pattern mask is broken.

In some embodiments, the lifting-off solution comprises TMAH. In some embodiments, the lifting-off solution further comprises silicic acid. The silicic acid acts as a passivating agent, as further described above with respect to the method 100 of masking a substrate. For example, the silicic acid passivates an exposed surface of the exemplary aluminum cladding on the polyimide substrate to protect the exposed aluminum cladding from any corrosive effect of the TMAH agent in the lifting-off solution.

In some embodiments, the method 200 of patterning a substrate further comprises enhancing 240 adhesion of the liquid toner pattern mask to the substrate prior to patterning 220. Enhancing 240 adhesion is essentially similar to enhancing 130 adhesion described above with respect to the method 100 of masking a substrate. In some embodiments, enhancing 240 adhesion comprises annealing the pattern mask, as described above. In other embodiments, enhancing 240 adhesion comprises coating the substrate with an adhesion enhancer prior to applying 210 the liquid toner pattern mask. For example, the adhesion enhancer may comprise one or more of an amino-organosilane and polyethyleneimine that is coated onto a surface of the substrate prior to applying 210 the liquid toner pattern mask.

Figure 3:
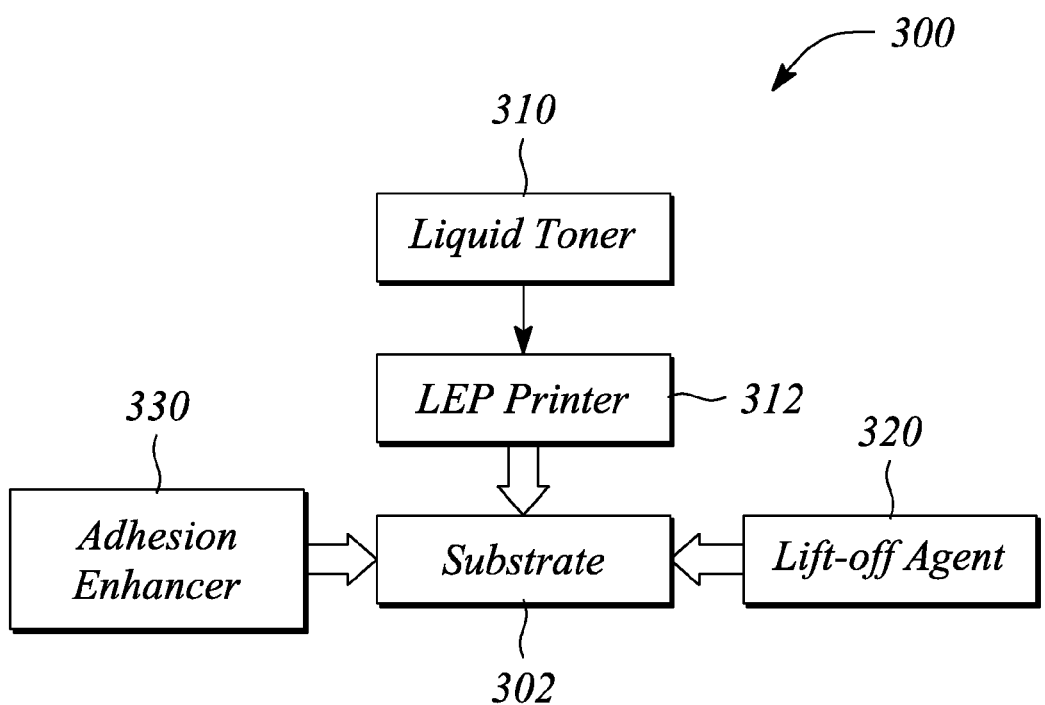
FIG. 3 illustrates a block diagram of a liquid toner-based pattern mask system according to an embodiment of the present invention.

FIG. 3 illustrates a block diagram of a liquid toner-based pattern mask system 300 according to an embodiment of the present invention. The liquid toner-based pattern mask system 300 is employed to pattern a substrate 302. In various embodiments, patterning the substrate 302 using the liquid toner-based pattern mask system 300 comprises one or more of pattern etching and pattern lift-off.

The liquid toner-based pattern mask system 300 (i.e., 'system 300' for simplicity of discussion) comprises a polymer-based liquid toner 310 and a liquid electrophotographic (LEP) printer 312. The liquid toner acts as a pattern mask on a surface of the substrate 302 when the liquid toner is applied to the surface using the liquid electrophotographic (LEP) printing. In particular, the polymer-based liquid toner 310 is applied to the surface of the substrate 302 by the LEP printer 312 to produce a liquid toner pattern mask used for patterning the substrate 302.

In some embodiments, the polymer-based liquid toner 310 comprises a carrier liquid and toner particles dispersed in the carrier liquid. The toner particles comprise a polymer. The polymer comprises a polymer blend, in some embodiments. For example, the liquid toner 310 may be any of the liquid toners described above including, but not limited to, HP ElectroInk. Similarly, the LEP printer 312 may be any of an HP Indigo press ws4050, HP Indigo press ws4500, or an HP Indigo press 5000 series printer, for example.

The liquid toner-based pattern mask system 300 further comprises a lift-off agent 320. The lift-off agent 320 degrades a bond between the applied liquid toner 310 and the substrate 302 surface. The lift-off agent 320 facilitates removal of the pattern mask following substrate patterning and, in some embodiments, further facilitates patterning. Specifically, the lift-off agent 320 is applied to the substrate 302 either after patterning (e.g., pattern etching) to remove the pattern mask (i.e., mask lift-off) or during patterning (e.g., pattern lift-off) to both remove the pattern mask and concomitantly facilitate patterning. In various embodiments, the lift-off agent 320 is essentially similar to any of the embodiments of the lift-off agent or lift-off solution described above with respect to removing 120 the pattern mask of the method 100 of masking a substrate and lifting-off 220 the pattern mask of the method 200 of patterning a substrate. For example, the lift-off agent 320 may comprise TMAH. In some embodiments, the lift-off agent 320 further comprises a passivating agent such as, but not limited to, silicic acid.

The liquid toner-based pattern mask system 300 further comprises an adhesion enhancer 330 between the applied liquid toner 310 and the surface of the substrate 302. The adhesion enhancer 330 facilitates the bond between the applied liquid toner 310 and the substrate 302 surface. The adhesion enhancer 330 is applied to the substrate 302 prior to the application of the liquid toner 310 pattern mask using the LEP printer 312. The adhesion enhancer 330 may be essentially similar to the adhesion enhancer employed in enhancing 130, 240 adhesion described above with respect to the method 100 of masking and the method 200 of patterning, respectively. In some embodiments, the adhesion enhancer 330 is optional in the system 300.

Thus, there have been described embodiments of a method of masking a substrate, a method of patterning a substrate and a mask system that employ liquid toner to produce a pattern mask. It should be understood that the above-described embodiments are merely illustrative of some of the many specific embodiments that represent the principles of the present invention. Clearly, those skilled in the art can readily devise numerous other arrangements without departing from the scope of the present invention as defined by the following claims.

What is claimed is:

1. A method of masking a substrate, the method comprising:
   using a liquid toner as a pattern mask, the liquid toner comprising a carrier liquid and toner particles dispersed in the carrier liquid, the toner particles comprising a polymer,
   wherein the liquid toner is deposited on the substrate as the pattern mask.

2. The method of masking a substrate of claim 1, wherein using a liquid toner comprises depositing and fusing the liquid toner on a surface of the substrate using offset liquid electrophotographic (LEP) printing.

3. The method of masking a substrate of claim 1, wherein using a liquid toner comprises:
   depositing the liquid toner as a patterned toner on the substrate, the patterned toner being fused to produce the pattern mask on a surface of the substrate; and
   removing the pattern mask using a lift-off agent having a basic pH to break a bond between the surface of the substrate and the pattern mask.

4. The method of masking a substrate of claim 3, wherein the lift-off agent is a liquid solution comprising one or more of tetramethyl ammonium hydroxide (TMAH), sodium hydroxide, potassium hydroxide, benzyltrimethylammonium hydroxide, tetraethylammonium hydroxide and tetrapropylammonium hydroxide.

5. The method of masking a substrate of claim 3, wherein using a liquid toner further comprises enhancing adhesion of the deposited patterned toner to the surface of the substrate.

6. The method of masking a substrate of claim 5, wherein enhancing adhesion comprises one or both of (a) exposing the surface of the substrate to one or more of an amino-organosilane, polyethyleneimine, and a plasma comprising oxygen prior to depositing the patterned toner and (b) annealing the deposited patterned toner.

7. The method of masking a substrate of claim 1 employed in patterning the substrate, wherein patterning comprises pattern etching a layer on the surface of the substrate using the pattern mask to protect portions of the layer during etching.

8. A method of patterning a substrate, the method comprising:
   applying a pattern mask to the substrate using liquid electrophotographic (LEP) printing, the pattern mask comprising a polymer-based liquid toner;

patterning the substrate using the pattern mask; and
lifting-off the pattern mask from the patterned substrate,
wherein lifting-off comprises exposing the substrate to a lift-off solution having a basic pH such that a bond between the substrate and the pattern mask is broken.

9. The method of patterning a substrate of claim 8, wherein applying a pattern mask comprises roll-to-roll printing of the pattern mask, the substrate being a flexible sheet having a metal film to be patterned on the surface, the surface being one or both of a front side and a back side of the flexible sheet.

10. The method of patterning a substrate of claim 8, wherein the lift-off solution comprises tetramethyl ammonium hydroxide (TMAH).

11. The method of patterning a substrate of claim 8, wherein the substrate comprises an aluminum film on a surface of the substrate, patterning comprising pattern etching the aluminum film using a wet etchant having an acid pH, and wherein the lift-off solution comprises tetramethyl ammonium hydroxide (TMAH) and silicic acid in an aqueous solution.

12. The method of patterning a substrate of claim 8, further comprising enhancing adhesion between the pattern mask and the substrate prior to patterning the substrate.

13. The method of patterning a substrate of claim 12, wherein enhancing adhesion comprises coating the substrate with an adhesion enhancer prior to applying the pattern mask, the adhesion enhancer comprising an amino-organosilane.

14. The method of patterning a substrate of claim 8, wherein patterning the substrate comprises pattern etching using one or both of wet etching and dry etching, the pattern mask protecting portions of a metal film on the substrate from exposure to the etchant.

15. A liquid toner-based pattern mask system comprising:
a polymer-based liquid toner, the liquid toner acting as a pattern mask on a surface of a substrate, the pattern mask being employed in patterning the substrate; and
a lift-off agent that degrades a bond between the surface of the substrate and the pattern mask to facilitate removal of the pattern mask following substrate patterning.

16. The liquid toner-based pattern mask system of claim 15, wherein the polymer-based liquid toner comprises a carrier liquid and toner particles dispersed in the carrier liquid, the toner particles comprising one of a polymer and a polymer blend, the polymer blend comprising a mixture of polymers and copolymers.

17. The liquid toner-based pattern mask system of claim 15, wherein the lift-off agent comprises a solution having a basic pH.

18. The liquid toner-based pattern mask system of claim 17, wherein the lift-off agent further comprises a passivating agent.

19. The liquid toner-based pattern mask system of claim 18, further comprising a liquid electrophotographic (LEP) printer to deposit a patterned liquid toner on the substrate as the pattern mask.

20. The liquid toner-based pattern mask system of claim 15, wherein the lift-off agent comprises tetramethyl ammonium hydroxide (TMAH).

21. The liquid toner-based pattern mask system of claim 15, further comprising an adhesion enhancer provided to the surface of the substrate, the adhesion enhancer facilitating the bond between the pattern mask and the surface.

* * * * *